United States Patent [19]

Wilber

[11] Patent Number: 4,999,549
[45] Date of Patent: Mar. 12, 1991

[54] SWITCHED MODE VERTICAL DEFLECTION SYSTEM AND CONTROL CIRCUIT

[75] Inventor: James A. Wilber, Indianapolis, Ind.

[73] Assignee: RCA Licensing Corporation, Princeton, N.J.

[21] Appl. No.: 515,901

[22] Filed: Apr. 27, 1990

[51] Int. Cl.$^5$ .................... H01J 29/70; H01J 29/72
[52] U.S. Cl. ................................ 315/387; 315/403
[58] Field of Search ................ 315/403, 397, 371, 387

[56] References Cited

U.S. PATENT DOCUMENTS

| | | | |
|---|---|---|---|
| 4,048,544 | 9/1977 | Haferl | 315/408 |
| 4,081,721 | 3/1978 | Haferl | 315/389 |
| 4,234,826 | 11/1980 | Dietz | 315/393 |
| 4,544,864 | 10/1985 | Haferl | 315/393 |
| 4,795,949 | 1/1989 | Wilber | 315/397 |
| 4,916,371 | 4/1990 | Coccetti et al. | 315/397 |

Primary Examiner—Theodore M. Blum
Attorney, Agent, or Firm—Joseph S. Tripoli; Joseph J. Laks; Harvey D. Fried

[57] ABSTRACT

A deflection system comprises: a signal generator, an amplifier stage, a negative feedback path and a vertical rate waveform generator. The signal generator is coupled to a source of flyback pulses for developing from energy in the flyback pulses a horizontal rate drive signal having a predetermined and substantially constant DC voltage reference level. The amplifier has a first input coupled for receiving the horizontal rate drive signal and an output coupled to a deflection coil. The amplifier output has a DC voltage reference level corresponding to the DC reference level of the horizonatl rate drive signal. A DC feedback signal on the negative feedback path is related to deflection current. The feedback path is coupled between the coil and a second input of the amplifier. The vertical rate waveform is also coupled to the second input of the amplifier for modulating the horizontal rate drive signal. The output of the amplifier is a pulse width modulated control signal for a switching element, for example a silicon controlled rectifier. In a switched mode vertical deflection system, the horizontal rate drive signal and the vertical rate waveform are ramp signals and the flyback pulses are horizontal flyback pulses. The signal generator is DC coupled between the source of flyback pulses and the amplifier. The signal generator comprises a Zener diode, a capacitor and a resistor connected in parallel.

24 Claims, 5 Drawing Sheets

SWITCHED MODE VERTICAL DEFLECTION SYSTEM AND CONTROL CIRCUIT

This invention relates generally to the field of deflection systems for televisions, and in particular, to switched mode vertical deflection systems and control circuits for same.

Switched mode vertical deflection systems derive power from horizontal deflection energy, by storing a portion of a horizontal trace or retrace energy each horizontal deflection cycle. The energy is supplied to a vertical deflection winding in order to provide the desired vertical deflection current in the deflection winding. The amount of horizontal rate energy stored each horizontal interval is closely controlled in order to provide the correct amount of vertical deflection current.

A typical output stage for a switched mode vertical deflection system may include a thyristor, for example a silicon controlled rectifier, coupled in parallel with a diode. The cathode of the thyristor and the anode of the diode are coupled to ground. The ungrounded terminals of the thyristor and diode are coupled in series with a storage coil and a winding of the integrated high voltage transformer (IHVT) and the vertical yoke, or deflection coil. A storage capacitor may be coupled between the junction of the winding of the integrated high voltage transformer and the vertical yoke and ground. Horizontal retrace pulses are coupled through the integrated high voltage transformer to the winding. The thyristor and diode, and the storage coil effect horizontal rate charging and discharging of the storage capacitor, the storage capacitor supplying vertical deflection current. Several switched mode deflection circuits, including the one described above, are illustrated in U.S. Pat. No. 4,544,964-Haferl.

Such a switched mode vertical deflection system can be controlled by pulses supplied to the gate of the silicon controlled rectifier, to control conduction thereof. Such control circuits often comprise a comparator, for example an operational amplifier, having a horizontal rate ramp signal as one input and a vertical rate ramp signal as another input. The vertical rate ramp signal may be generated by a conventional ramp generating circuit which supplies DC current to an integrator, for example a capacitor, which is periodically reset at a vertical rate, for example by vertical reset pulses. The vertical rate ramp signal is combined with a feedback signal related to vertical deflection current. The feedback signal may have a DC component, an AC component, or both.

The horizontal rate ramp generator for the horizontal rate ramp signal may also be powered by horizontal flyback pulses. Typically, the horizontal rate ramp signal is developed from clipped flyback pulses which are AC coupled to an integrator. The resulting ramp is added to an independently generated DC reference level and coupled to one input of the amplifier or comparator, for example the inverting input. The independently generated DC reference level sets the DC reference level for the output of the amplifier or comparator.

A horizontal rate ramp generator as described above can cause distortion of the raster. The AC coupling of the flyback pulses has an inherent time constant, which can adversely affect the vertical rate feedback gain and can adversely affect linearity. However, such an arrangement was thought to be necessary in order to avoid distortion of the horizontal rate ramp signal due to amplitude variations of the horizontal flyback pulses. Amplitude variations of horizontal flyback pulses can result from variations in beam current loading and from transient disturbances during the transition from vertical retrace to vertical trace. Vertical rate timing disturbances, particularly in switched mode vertical systems, can alter the amplitude, period and width of the horizontal flyback pulses. The timing disturbance is of course at a vertical rate. The AC coupling of such an arrangement also makes it necessary to generate the DC reference level for the amplifier or comparator.

It is an aspect of the invention to improve transient response of switched mode vertical deflection systems by providing an improved circuit for generating the horizontal rate ramp signal and establishing the DC reference level for the amplifier or comparator. In accordance with this aspect of the invention, the horizontal flyback pulses are utilized for generating a horizontal rate ramp with only DC coupling through to the amplifier or comparator, rather than AC coupling. The DC reference level of the horizontal rate ramp signal sets the DC reference level for the amplifier of comparator.

A switched mode deflection system according to this aspect of the invention comprises: a switched mode deflection output stage for driving a deflection coil; a negative feedback path for a feedback signal related to deflection current; and, a generator for a first deflection rate waveform. A control circuit comprises a signal generator and a comparator. The signal generator is coupled to a source of flyback pulses for developing from energy in the flyback pulses a second deflection rate waveform having a predetermined and substantially constant DC voltage reference level set by operation of the signal generator. The comparator has a first input coupled for receiving the second deflection rate waveform, has a second input coupled for receiving the first deflection rate waveform and the feedback signal and has an output controlling switching in the output stage. The amplifier output has a DC voltage reference level corresponding to the DC reference level of the first deflection rate waveform. The signal generator is DC coupled between the source of flyback pulses and the comparator.

More particularly, a switched mode vertical deflection system according to this aspect of the invention comprises: a switched mode vertical deflection output stage for driving a vertical deflection coil; a feedback circuit for generating a feedback signal related to vertical deflection current; and, a circuit for generating a vertical rate ramp signal. The comparator or amplifier has an output controlling switching in the output stage. The first input of the comparator, for example a noninverting input, is coupled for receiving the vertical rate ramp signal and the feedback signal. The signal generator is DC coupled between the source of horizontal flyback pulses and the second input of the comparator, for example an inverting input, for developing from energy in the horizontal flyback pulses a horizontal rate ramp signal having a predetermined and substantially constant DC voltage reference level. The amplifier output has a DC voltage reference level corresponding to the DC reference level of the horizontal rate ramp signal.

In further accordance with this aspect of the invention, the comparator and the output stage, as previously described, may be alternately be thought of as an amplifier stage. In this configuration, a deflection system, comprises: a signal generator, an amplifier, a negative feedback path and a vertical rate waveform generator. The signal generator is coupled to a source of flyback pulses for developing from energy in the flyback pulses a horizontal rate drive signal having a predetermined and substantially constant DC voltage reference level. The amplifier has a first input coupled for receiving the horizontal rate drive signal and an output coupled to a deflection coil. The amplifier output has a DC voltage reference level corresponding to the DC reference level of the horizontal rate drive signal. A DC feedback signal on the negative feedback path is related to deflection current. The feedback path is coupled between the coil and a second input of the amplifier. The vertical rate waveform is also coupled to the second input of the amplifier for modulating the horizontal rate drive signal. The output of the amplifier is a pulse width modulated control signal for a switching element, for example a silicon controlled rectifier.

The timing control circuit for vertical deflection can assume a free running mode during channel change, when vertical synchronizing pulses are no longer available. The free running frequency is somewhat slower than the normal vertical deflection rate. This increases the period and amplitude of the vertical rate ramp signal, which can disturb the vertical position of on screen displays during channel change. An adjustment of the vertical rate ramp, in either period or slope, or both must be made in order to avoid disturbing such on screen displays. A control signal can be generated, for example by a microprocessor, for initiating such a change in the vertical rate ramp generator. A transistor switch may be activated to change the time constant of the ramp generating network, for example, during channel change. However, there is a residual transient period of time after vertical sync is established again, but before the vertical deflection system has assumed a steady state condition. In previous circuits, for example that shown in U.S. Pat. No. 4,795,949 - Wilber, a certain time delay in resuming generation of the steady state ramp occurs due to signal propagation delays in the feedback path from the vertical yoke to the control circuit. Such delays can be circuit specific, and not necessarily a characteristic of all vertical deflection systems.

In accordance with a further aspect of the invention, the switch responsive to a channel change related control signal can be held positively and intentionally in a conductive condition for an additional predetermined period of time, in order for the transient disturbances associated with reestablishing vertical sync to dissipate. In accordance with this aspect of the invention, a capacitor is charged by the control signal, which also provides base drive for a transistor switch. The capacitor remains charged, and can not begin discharging, until after the control signal terminates. After termination of the control signal, current from the capacitor can maintain base drive of the transistor switch for a predetermined period time, for example, approximately three milliseconds.

Figure 1:
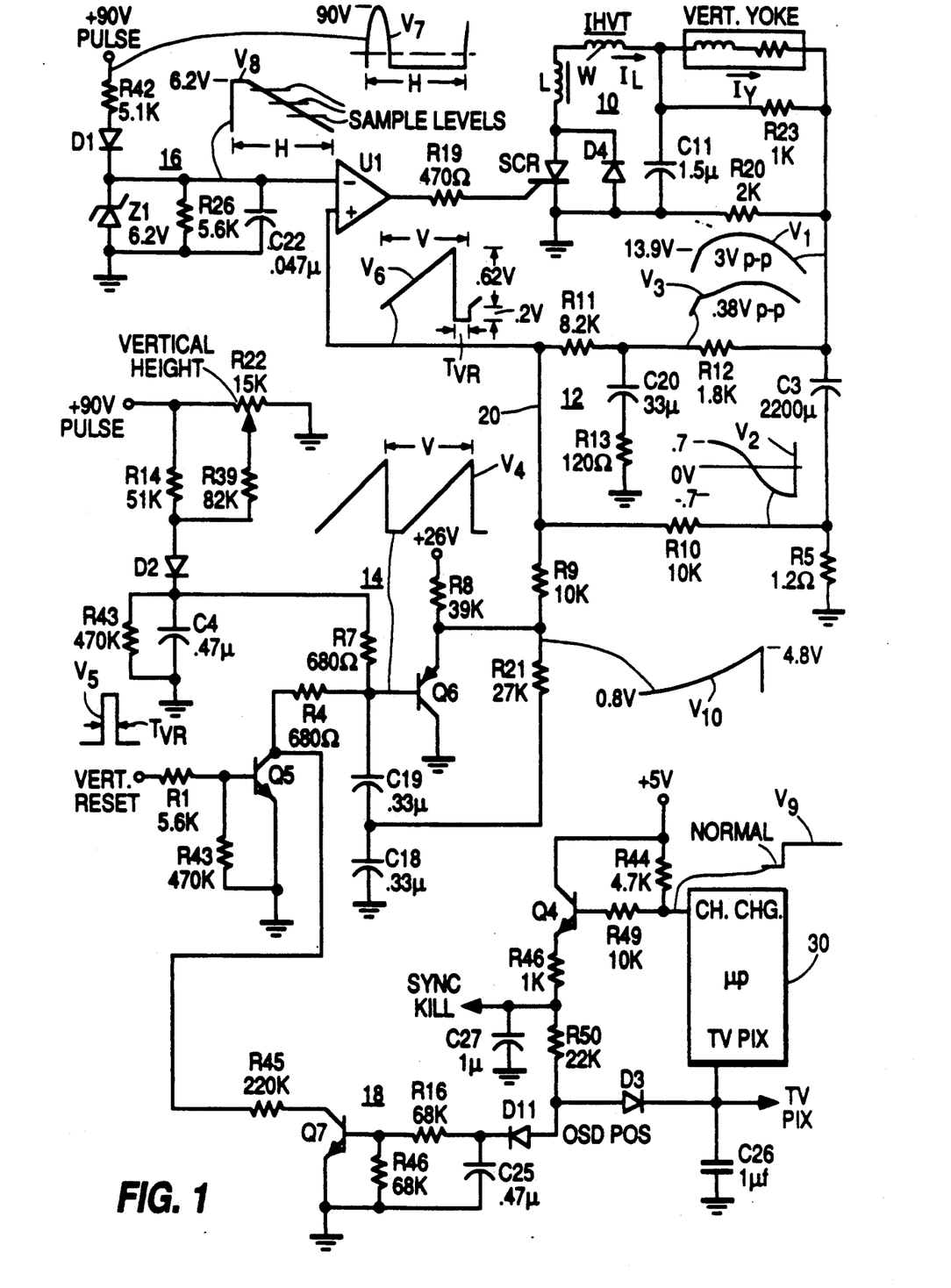
FIG. 1 is a circuit schematic for a switched mode vertical deflection system having a control circuit in accordance with aspects of this invention.

A switched mode vertical deflection system and control circuit comprises generally an output stage 10, a feedback stage 12, a vertical rate ramp stage 14, a horizontal rate ramp stage 16 and a vertical rate ramp modifying stage 18, operable during channel change. In output stage 10, diode D4 is conductive during the horizontal retrace interval. Current flows from ground through the diode D4, through stage coil L and winding W of the integrated high voltage transformer, to charge capacitor C11. The charge on capacitor C11 causes a deflection current to flow from capacitor C11 through the coil of the vertical deflection yoke. A thyristor, for example silicon controlled rectifier SCR is conductive during a portion of a horizontal trace interval. During conduction of the SCR, current flows from capacitor C11 through winding W and storage coil L to ground through the SCR. The conduction time through the SCR is controlled by the output of control circuit 16. Resistor R23 is connected in parallel with the deflection yoke as a yoke damping resistor. Resistor R20 provides vertical centering.

Feedback stage 12 receives a vertical rate, generally parabolic feedback signal $V_1$. The york current $I_Y$ is AC coupled by capacitor C3 to sense resistor R5. An AC feedback signal component $V_2$ related to deflection current is coupled through resistor R10 to a summing junction 20. A DC feedback signal path through resistors R11 and R12 is also coupled to summing junction 20. The DC feedback signal path includes an RC network comprising capacitor C20 and resistor R13. This network effects an integration of the generally parabolic feedback signal to provide a generally S-shaped feedback signal $V_3$, also related to deflection current.

Vertical rate ramp stage 14 includes a transistor Q6 coupled in emitter-follower configuration. Flyback pulses coupled to a resistor network including resistors R14, R22 and R39 are rectified by diode D2 to develop a DC voltage source across capacitor C4 and resistor R43. During normal operation, other than during channel change, the DC basis on the base transistor Q6 is fixed by resistors R7 and R4. The DC signal is integrated by capacitor C19, to develop a ramp. Vertical reset pulses $V_5$ coupled through resistor R1 to the base of transistor Q5 periodically cause conduction of transistor Q5 to discharge capacitor C19 at the vertical deflection rate. The pulse width of the vertical reset pulses is designated $T_{VR}$. Pulse width $T_{VR}$ is reflected in waveforms $V_4$ and $V_6$. The base of transistor Q5 is biased by resistor R3. The result is a vertical rate ramp $V_4$ at the base of Q6, which appears with only slightly reduced amplitude at the emitter of transistor Q6. A feedback path formed by resistor R21 and capacitor C18 distort the ramp to be slightly parabolic as shown by signal $V_{10}$, in order to compensate for certain distortion in the feedback paths. The vertical rate ramp signal is coupled to summing junction 20 through resistor R9. Resistor R22 is a variable resistor which provides for variable height adjustment.

Control circuit 16 includes a comparator U1 and a horizontal rate ramp generator formed by Zener diode Z1, capacitor C22 and resistor R26, which are coupled in parallel with one another. The terminal of the parallel combination including the anode of Zener diode Z1 is grounded. The terminal of the parallel combination connected to the cathode of Zener diode Z1 is coupled to one input of comparator U1, for example an inverting input, and to the cathode of diode D1. The horizontal rate waveform is generated from energy in the flyback pulses because the horizontal rate ramp generator, having no active switches or amplifiers, is a passive network. Flyback pulses are coupled to the anode of diode D1 through resistor R42. Another input of comparator U1, for example a noninverting input, is coupled to summing junction 20. Waveform $V_6$ reflects the combination of vertical rate ramp $V_4$, AC feedback signal $V_2$ and DC feedback signal $V_3$. The output of comparator U1 is coupled to the gate of the SCR through resistor R19.

The control circuit 16 develops both the DC voltage reference level and the horizontal rate reference ramp required for controlling the switched mode vertical output stage. Comparator U1 functions as a combination error amplifier and voltage to phase converter. During the flyback pulse part of waveform $V_7$, current through resistor R42 initially charges capacitor C22 to the rated voltage Zener diode Z1, 6.2 volts for the example shown. Thereafter, current supplied through resistor R42 flows to ground through the Zener diode. After the flyback pulse ends, diode D1 becomes reverse biased. Capacitor C22 then discharges through resistor R26 defining the required ramp. The resulting ramp is substantially independent of variations in the amplitude of the flyback pulses of voltage signal $V_7$. The reference Zener can be driven to the full $I_{ZT}$ specification with negligible power, due to the small duty cycle of the Zener current. The DC reference level of the ramp signal becomes the DC reference level for the output of the comparator. The DC reference level need not be set independently of the ramp signal. Each successive ramp shape pulse of signal $V_8$ will be sampled at a different and successively higher level by vertical rate ramp $V_6$. This provides the necessary modulation in gating conduction of the SCR to provide vertical deflection current.

Figure 2:
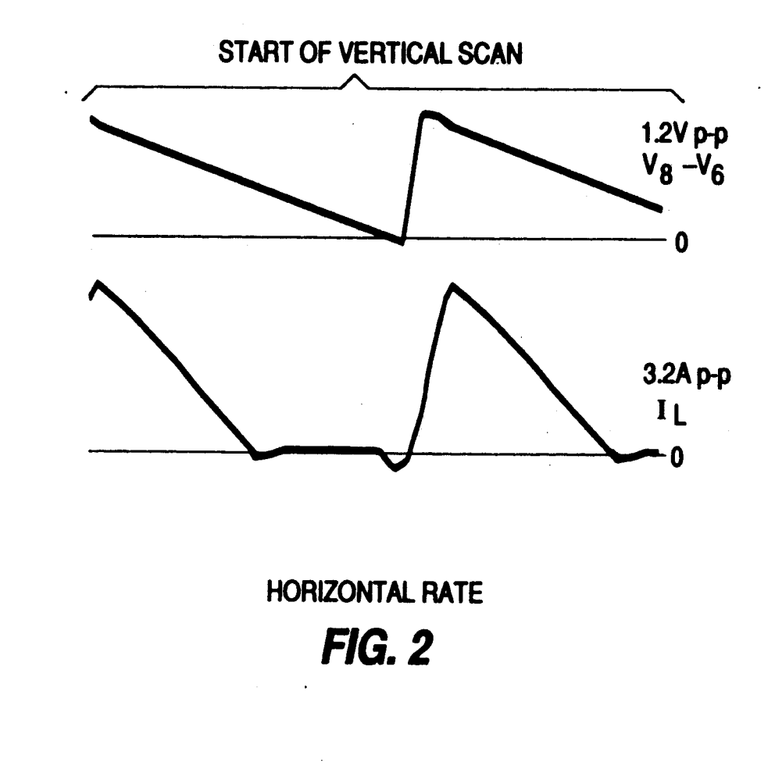
FIGS. 2 and 3 are waveform diagrams useful for illustrating operation of the deflection system shown in FIG. 1 near the start of vertical scanning.
Figure 3:
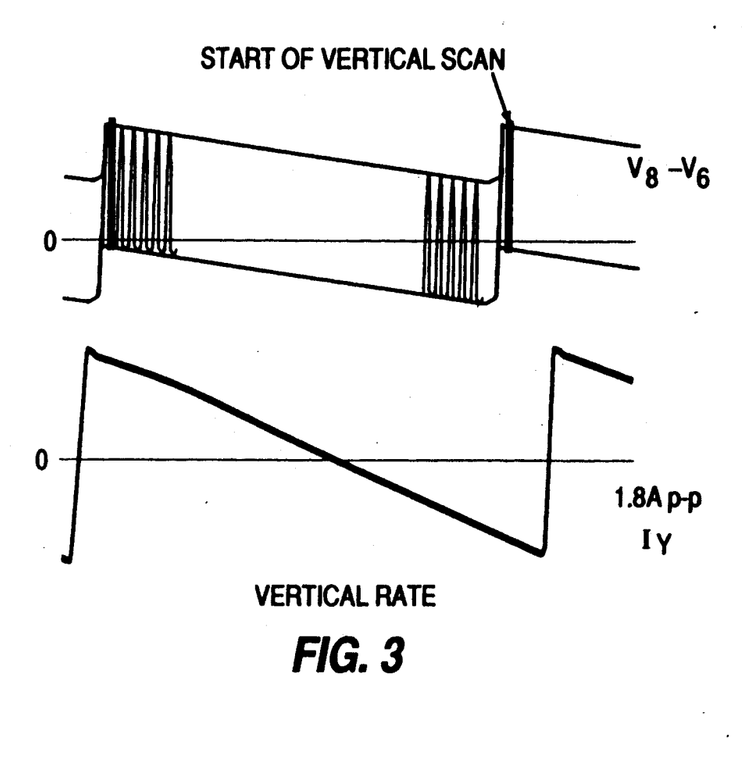
Figure 4:
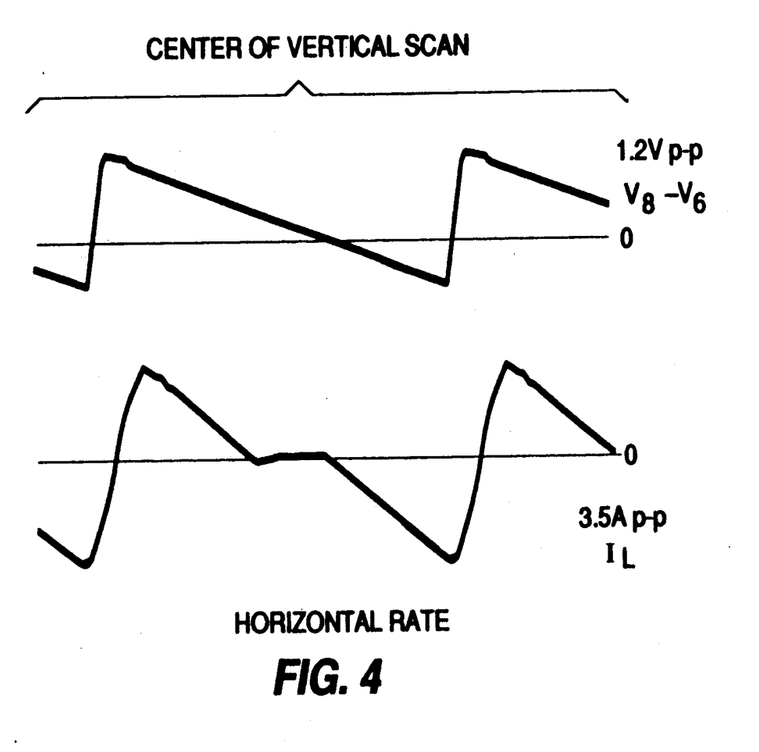
FIGS. 4 and 5 are waveform diagrams useful for illustrating operation of the deflection system shown in FIG. 1 near the center of vertical scanning.
Figure 5:
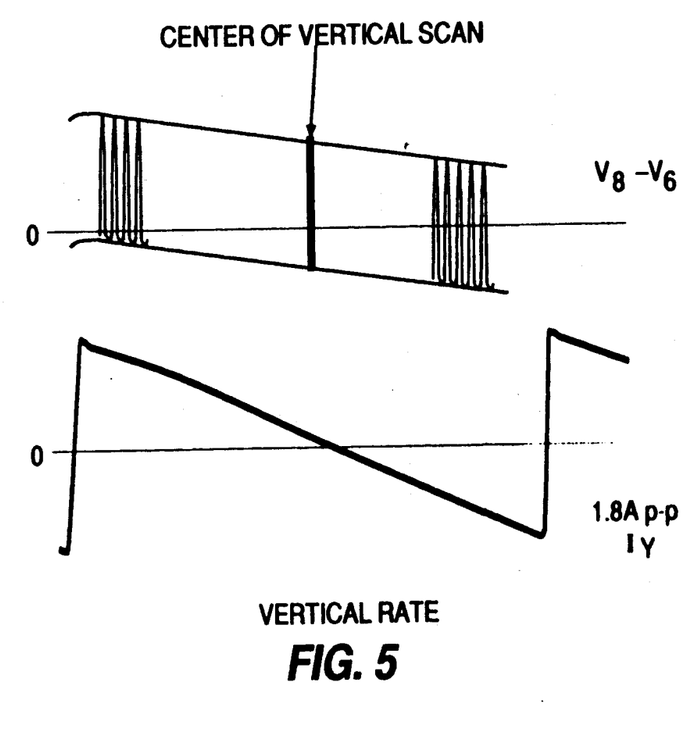
Figure 6:
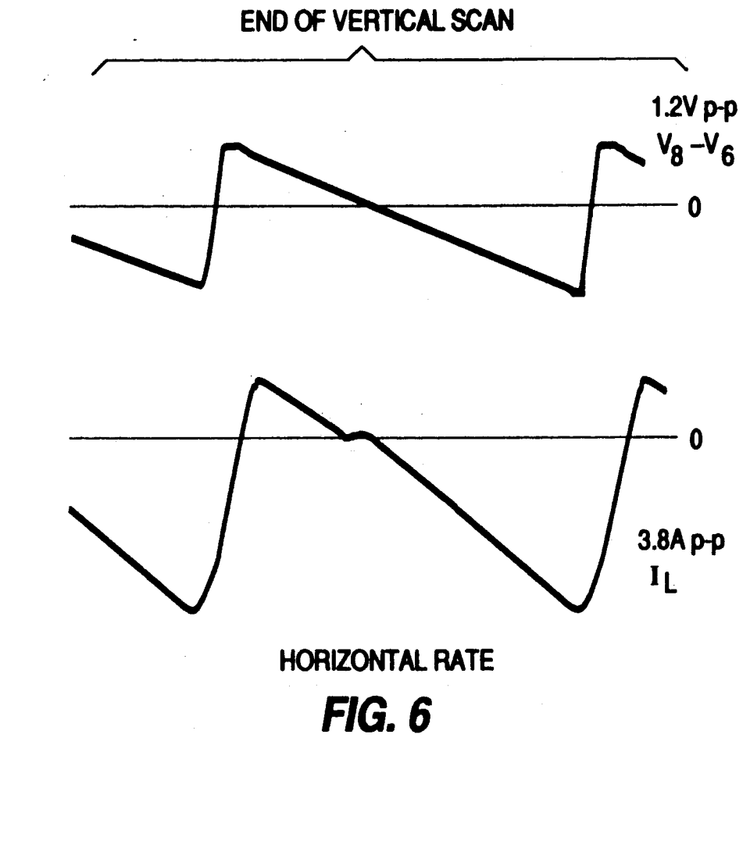
FIGS. 6 and 7 are waveform diagrams useful for illustrating operation of the deflection system shown in FIG. 1 near the end of vertical scanning.
Figure 7:
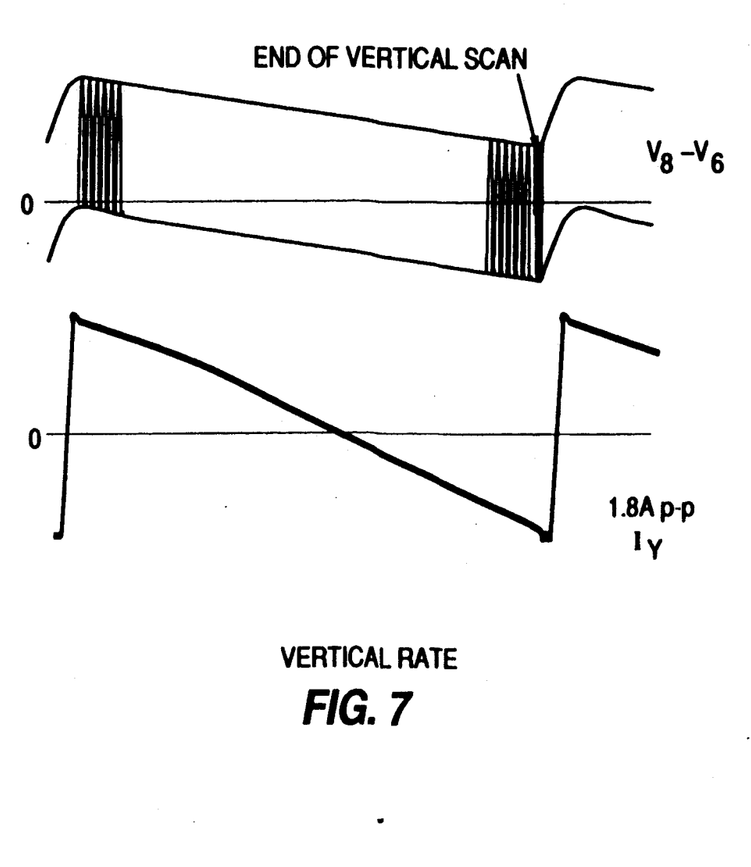
Figure 8:
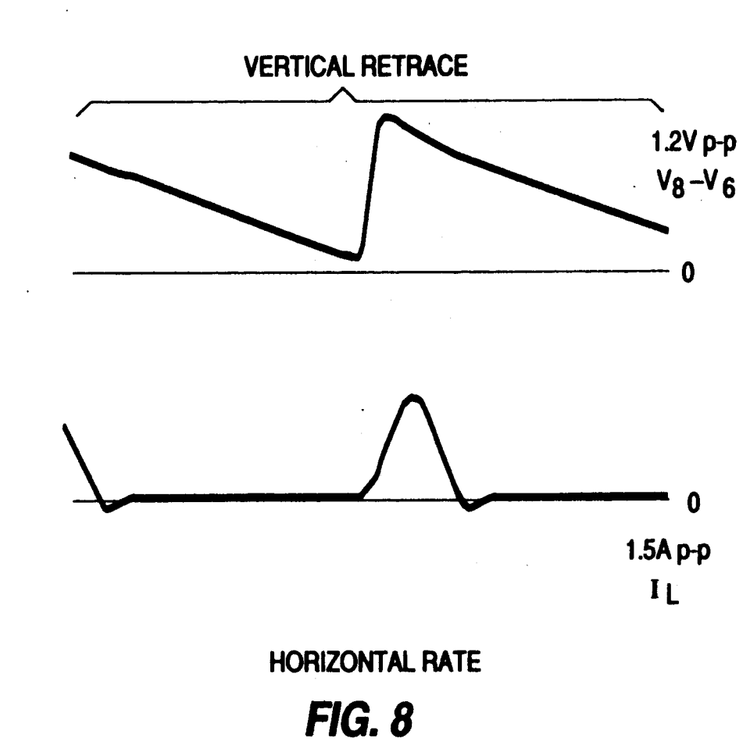
FIGS. 8 and 9 are waveform diagrams useful for illustrating operation of the deflection system shown in FIG. 1 at vertical retrace.

In each of FIGS. 2-9, the upper waveform reflects the output of the comparator U1, namely the difference of signal $V_8$–signal $V_6$. In FIGS. 2, 4, 6 and 8, the lower waveform is the current $I_L$ through the storage coil and transformer winding, and the time scale is the horizontal deflection rate. In FIGS. 3, 5, 7 and 9, the lower waveform is the current $I_Y$ through the yoke, and the time scale is the vertical deflection rate. The time position of the waveforms in FIG. 2, shown in the expanded time scale of the horizontal rate, is indicated by the dark vertical bar and corresponding legend Start of Vertical Scan in FIG. 3. The time position of the waveforms in FIG. 4, shown in the expanded time scale of the horizontal rate, is indicated by the dark vertical bar and corresponding legend Center of Vertical Scan in FIG. 5. The time position of the waveforms in FIG. 6, shown in the expanded time scale of the horizontal rate, is indicated by the dark vertical bar and corresponding legend End of Vertical Scan in FIG. 7. The time position of the waveforms in FIG. 8, shown in the expanded time scale of the horizontal rate, is indicated by the dark vertical bar and corresponding legend Vertical Retrace in FIG. 9.

Horizontal retrace pulses forward bias the diode D4. Current $I_L$ flows from ground through diode D4, through coil L and through winding W to charge capacitor C11. Diode D4 becomes reverse biased during horizontal trace and stops conducting. Capacitor C11 discharges during horizontal trace, causing deflection or yoke current $I_Y$ to flow through the vertical deflection coil. Current $I_L$, and therefore current $I_Y$, would be substantially constant, but for the action of the SCR. The SCR conducts responsive to gating pulses supplied by the comparator U1. The gating pulses occur during a portion of each horizontal trace interval. When the SCR conducts, some of the current discharged by capacitor C11 is diverted from $I_Y$ through the winding W, the storage coil L and the SCR to ground, during which time the flow of current $I_L$ is negative. Each successive horizontal trace interval is associated with a progressively longer gating conduction interval of the SCR, which results in more negative current $I_L$ and less yoke deflection current $I_Y$. The progressive increased conduction of the SCR and the corresponding decreased amount of yoke current $I_Y$ defines the desired sawtooth vertical deflection waveform.

In FIGS. 2 and 3, near the start of vertical scanning, the SCR is gated on for a near minimum time, current $I_L$ is mostly positive and deflection current $I_Y$ is near maximum. In FIGS. 4 and 5, near the center of vertical scanning, the SCR is gated on for near to half way between minimum and maximum, current $I_L$ is approximately half positive and half negative, and deflection current $I_Y$ is near to half way between minimum and maximum. In FIGS. 6 and 7, near the end of vertical scanning, the SCR is gated is gated on for a near to maximum time. The current $I_L$ is much more negative than positive, and the deflection current $I_Y$ is near to minimum.

Figure 9:
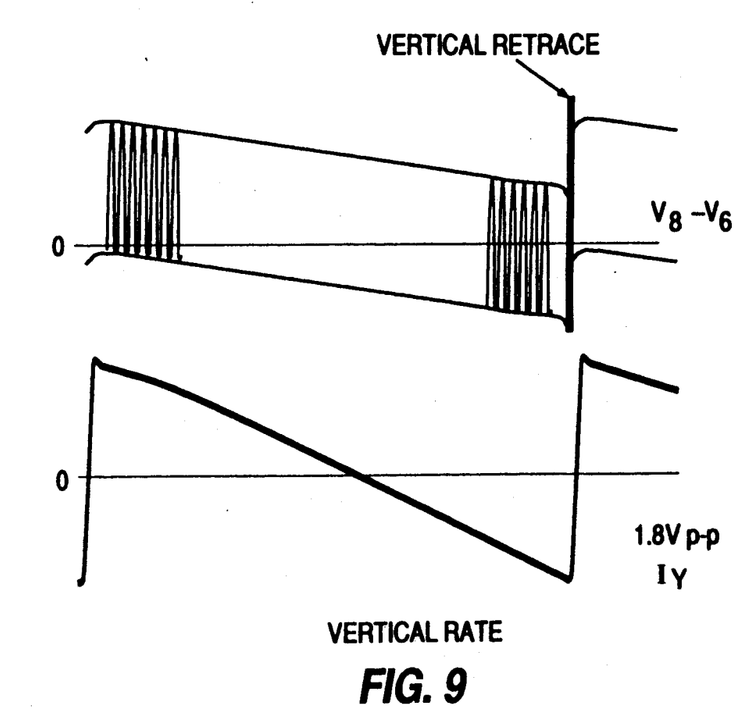

During vertical retrace, shown in FIGS. 8 and 9, the SCR is turned off because no gating pulses are provided by the comparator during most of the duration of the vertical reset pulse, shown in waveform $V_5$. The diode D4 is forward biased during part of each horizontal retrace pulse, providing positive current $I_L$ to charge capacitor C11. Capacitor C11 is also charged by energy stored in the inductance of the vertical deflection coil. As soon as the magnitude of the combination of the vertical rate ramp signal $V_4$ ($V_{10}$ as modified), AC feedback signal $V_2$ and DC feedback signal $V_3$ at summing junction 20 is large enough to establish a sample level for horizontal rate ramp signal $V_8$, the SCR begins progressive conduction again for the next vertical trace interval.

The horizontal rate ramp generator is DC coupled between the source of horizontal flyback pulses and the noninverting input of the comparator U1. This improves the transient response of the entire control system, as the control system is not prone to adverse disturbance of vertical feedback gain and disturbance of raster linearity. Moreover, the horizontal rate ramp signal can be generated with a predetermined DC reference level, with many fewer components than generally required.

Changing channels can result in the loss of synchronizing signals. Many timing control circuits for vertical deflection systems assume a free running mode of operation at a frequency slightly lower than the vertical deflection frequency when vertical synchronizing pulses are lost. This prevents vertical collapse of the raster, and subsequent damage to the cathode ray tube. The time between successive vertical reset pulses in signal $V_5$ will be increased during the free running mode, as a consequence of the reduced frequency. The increased time between adjacent vertical reset pulses results in the amplitude of the vertical rate ramp $V_4$ increasing undesirably, which can in turn disturb the position of on screen displays which are intended to remain in place during channel change. Vertical rate ramp modifying circuit 18 compensates for this undesirable amplitude variation of the vertical rate ramp signal $V_4$. A microprocessor 30 controlling many functions of a television generates, inter alia, a channel change (CH. CHG.) signal $V_9$ coupled to the base of transistor switch Q4 through resistor R49. Resistor R44 is coupled from the channel change output pin to a +5 volt supply, which is also coupled to the collector of transistor Q4. A network comprising resistors R46 and R50 and capacitor C27 provides an output signal designated SYNC KILL used elsewhere in the television system. The channel change signal is also coupled to the output pin of the microprocessor designated TV PIX by diode D3. Accordingly, the output of the channel change pin can generate a TV PIX signal, but a TV PIX output will not be effective as a channel change control signal. The junction of resistor R50 and diode D3 is an on screen display position control signal designated OSD POS. Diode D11 becomes forward biased when transistors Q4 conducts, charging capacitor C25 and providing base drive to transistor Q7 through resistor R16. The base of transistor Q7 is biased by resistor R46. When transistor Q7 conducts, resistor R45 is coupled in series between the junction of resistor R4 and the collector of Q5, and ground. This effectively changes the DC reference of the vertical rate ramp signal $V_4$, so that the maximum amplitude corresponds more closely to the maximum amplitude when vertical sync is present. Accordingly, many on screen displays can remain substantially in position during channel change, particularly those positioned near the top of the raster, such as channel numbers. In the absence of a channel change control signal, the operation of vertical rate ramp circuit 14 is not affected.

What is claimed is:

1. A deflection system, comprising:
   a passive network coupled to a source of flyback pulses for generating from energy in said flyback pulses a horizontal rate drive signal substantially independent of amplitude variations in said flyback pulses and having a substantially constant DC voltage reference level;
   an amplifier coupled for receiving said horizontal rate drive signal as an input and having an output for a control signal for driving a deflection coil, said control signal having a DC voltage reference level corresponding to said DC reference level of said horizontal rate drive signal;
   a feedback path for a signal related to deflection current coupled from said coil as an input of said amplifier; and,
   means for generating a vertical rate waveform coupled to said amplifier as an input, for pulse width modulating said control signal.

2. The system of claim 1, wherein said passive network comprises a Zener diode, a capacitor and a resistor in a parallel network having one junction coupled to one of said amplifier inputs and the other junction coupled to ground.

3. The system of claim 1, wherein said amplifier comprises:
   a comparator stage generating said pulse width modulated control signal responsive to said horizontal rate drive signal, said vertical rate waveform and said DC feedback signal; and,
   a switched output stage controlled by said pulse width modulated signal.

4. The system of claim 1, wherein said horizontal rate drive signal and said vertical rate waveform are ramp signals.

5. The system of claim 1, wherein said passive network comprises a Zener diode for setting a maximum amplitude level for said horizontal rate drive signal and setting said DC reference level for said amplifier output.

6. The system of claim 1, wherein said passive network is DC coupled between said source of flyback pulses and said amplifier.

7. The system of claim 1, wherein said feedback signal path comprises AC and DC negative feedback paths coupled in parallel.

8. The system of claim 1, wherein said feedback path comprises an integrating network.

9. A switched mode vertical deflection system, comprising:
   a switched mode vertical deflection output stage for driving a vertical deflection coil;
   means for generating a feedback signal related to vertical deflection current;
   means for generating a vertical rate ramp signal;
   a comparator having an output controlling switching in said output stage and coupled for receiving said vertical rate ramp signal and said feedback signal as inputs; and,
   a passive network DC coupled between a source of horizontal flyback pulses and an input of said comparator for generating from energy in said horizontal flyback pulses a horizontal rate ramp signal substantially independent of amplitude variations in said flyback pulses and having a substantially constant DC voltage reference level.

10. The system of claim 9, wherein said passive network comprises a Zener diode, a capacitor and a resistor in a parallel network, said network having one junction coupled as an input of said comparator and the other junction coupled to ground.

11. The system of claim 10, comprising a diode for coupling said flyback pulses to said one junction of said network.

12. The system of claim 9, wherein said feedback signal comprises a DC component and an AC component.

13. The system of claim 12, further comprising means for integrating said DC component of said feedback signal.

14. The system of claim 9, wherein said feedback signal comprises DC and AC feedback signals coupled to said comparator in parallel signal paths from said vertical deflection coil.

15. The system of claim 14, comprising an integrating network in said DC feedback signal path.

16. A deflection system, comprising:
   a deflection output stage for driving a deflection coil;
   means for generating a feedback signal related to deflection current;
   means for generating a first deflection rate waveform;
   a passive network coupled to a source of flyback pulses for generating from energy in said flyback pulses a second deflection rate waveform substantially independent of amplitude variations in said flyback pulses and having a substantially constant DC voltage reference level set by operation of said passive network; and, a comparator coupled for receiving said first and second deflection rate waveforms and said feedback signal as inputs and having an output controlling switching in said output stage, said amplifier output having a DC voltage reference level corresponding to said DC reference level of said first deflection rate waveform.

17. The system of claim 16, wherein said first deflection rate is a vertical deflection and said second deflection rate is a horizontal deflection rate.

18. The system of claim 17, wherein said first and second deflection rate waveforms are ramp signals.

19. The system of claim 16, wherein said first and second deflection rate waveforms are ramp signals.

20. The system of claim 16, wherein said flyback pulses are horizontal flyback pulses.

21. The system of claim 16, wherein said passive network comprises a Zener diode, a capacitor and a resistor in a parallel network, said network having one junction coupled as one of said inputs to said comparator and the other junction coupled to ground.

22. The system of claim 21, comprising a diode for coupling said flyback pulses to said one junction of said network.

23. The system of claim 16, wherein said feedback signal comprises DC and AC feedback signals coupled to said comparator in parallel signal paths from said vertical deflection coil.

24. The system of claim 23, comprising an integrating network in said DC feedback signal path.

* * * * *

UNITED STATES PATENT AND TRADEMARK OFFICE
CERTIFICATE OF CORRECTION

PATENT NO. : 4,999,549

DATED : March 12, 1991

INVENTOR(S) : JAMES ALBERT WILBER

It is certified that error appears in the above-identified patent and that said Letters Patent is hereby corrected as shown below:

Col. 7, line 49, delete "for a";

Col. 8, line 2, delete "DC";

Col. 9, line 6, delete "amplifier" and insert -- comparator --;

Col. 9, line 8, delete "first" and insert -- second --;

Col. 9, line 11, after "vertical deflection" insert -- rate --.

Signed and Sealed this

Fifth Day of January, 1993

Attest:

DOUGLAS B. COMER

Attesting Officer

Acting Commissioner of Patents and Trademarks